United States Patent
Lee et al.

(10) Patent No.: US 6,969,673 B2
(45) Date of Patent: Nov. 29, 2005

(54) SEMICONDUCTOR DEVICE WITH GATE SPACE OF POSITIVE SLOPE AND FABRICATION METHOD THEREOF

(75) Inventors: Chang-Huhn Lee, Kyunggi-do (KR); Mun-Mo Jeong, Seoul (KR); Wook-je Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/631,456

(22) Filed: Jul. 30, 2003

(65) Prior Publication Data

US 2004/0031994 A1 Feb. 19, 2004

(30) Foreign Application Priority Data

Aug. 14, 2002 (KR) .................... 10-2002-0048267

(51) Int. Cl.[7] .......................................... H01L 21/3205
(52) U.S. Cl. ...................................... 438/595; 438/978
(58) Field of Search ............................. 438/279, 283, 438/595, 763, 978

(56) References Cited

U.S. PATENT DOCUMENTS

| | | | | |
|---|---|---|---|---|
| 4,676,869 A | * | 6/1987 | Lee et al. | 438/763 |
| 5,858,865 A | * | 1/1999 | Juengling et al. | 438/978 |
| 5,879,459 A | * | 3/1999 | Gadgil et al. | 118/715 |
| 6,391,803 B1 | * | 5/2002 | Kim et al. | 438/787 |

* cited by examiner

*Primary Examiner*—Chandra Chaudhari
(74) *Attorney, Agent, or Firm*—Marger Johnson & McCollom, P.C.

(57) ABSTRACT

Embodiments of the invention provide a semiconductor device and a fabrication method for a semiconductor device that includes the processes of forming multiple gates on a silicon substrate, forming a gate spacer having a positive slope at the gate spacer edge, depositing a polysilicon layer on the silicon substrate between the gates, etching a portion of the polysilicon layer to form an opening exposing a portion of the silicon substrate, and forming an inter-insulation layer to the exposed portion of the silicon substrate to fill the opening. Using an annealing process applied to a layer in the gate spacer, the etch selectivity can be selectively controlled and consequently, the degree of slope at the gate spacer edge is predetermined.

10 Claims, 6 Drawing Sheets

SEMICONDUCTOR DEVICE WITH GATE SPACE OF POSITIVE SLOPE AND FABRICATION METHOD THEREOF

CROSS REFERENCE TO RELATED APPLICATIONS

This application claims priority from Korean Patent Application No. 2002-48267, filed on Aug. 14, 2002, the contents of which are hereby incorporated by reference for all purposes.

BACKGROUND OF THE INVENTION

1. Technical Field of the Invention

This disclosure relates to a semiconductor device and a fabrication method thereof and more particularly to a semiconductor device with a gate spacer having a positive slope in the edge thereof to prevent a bridge from generating due to polysilicon residues, and a fabrication method thereof.

2. Description of the Related Art

Generally, as the design rule of a semiconductor device is reduced, so is the space between gates. Therefore, a gap-fill process of an inter-insulation layer is an important issue. There are two conventional fabrication methods used to form an inter-insulation layer in semiconductor technology. One is to deposit an oxide layer between gates before depositing a polysilicon layer to form a contact pad. The other is to deposit a polysilicon layer for a contact pad between gates, which has a better gap-fill characteristic than an oxide layer, to etch a portion of the polysilicon layer, and to deposit an oxide layer in the etched portion of the polysilicon layer.

In the former fabrication method, a void is generated when the oxide layer is deposited in the narrow gap between the gates, and a bridge-fail is generated due to the void. Because the latter fabrication method first deposits a polysilicon layer that has an excellent gap-fill characteristic, and then deposits the oxide layer in the etched portion of the polysilicon layer, a void is not generated. Therefore, a bridge-fail due to the void does not happen.

FIG. 1A to FIG. 1E are cross sectional diagrams illustrating a conventional fabrication method of a semiconductor device.

Referring to FIG. 1A, a gate insulation layer 110 is grown on a silicon substrate 100. On the gate insulation layer 110, a polysilicon layer 121, a tungsten W layer 123, and a gate capping layer 125 are sequentially deposited. A gate 120 is formed by patterning the gate capping layer 125, the tungsten layer 123, and the polysilicon layer 121.

Next, to prevent an electric field concentration at the edge of the polysilicon layer and to protect a tungsten layer 123 of the gate 120, a gate poly oxidation process is performed to grow an oxide layer (not shown) on the silicon substrate 100 including the gate 120.

Referring to FIG. 1B, a middle temperature oxide (MTO) layer 131 is formed on the silicon substrate 100, and a nitride layer 133 for a gate spacer is deposited on the silicon substrate 100. Sequentially, the nitride layer 133 and the oxide layer 131 are etched to form a gate spacer 130 on the sidewall of the gate 120. A cleaning process is performed. The cleaning process uses a cleaning solution, such as the standard cleaning 1 (SC1) solution composed of ammonium hydroxide ($NH_4OH$), hydrogen peroxide ($H_2O_2$), and de-ionized (DI) water in a 1:4:20 volume ratio.

Referring to FIG. 1C, a polysilicon layer 140 for a contact pad is deposited on the silicon substrate 100 to fill the gap between gates, and planarization process, such as a chemical mechanical polishing (CMP) process, is performed on the polysilicon layer 140 to isolate a node.

Referring to FIG. 1D and FIG. 1E, the polysilicon layer 140 is etched to form an opening 150, and an inter-insulation layer 160, such as a high density plasma (HDP) oxide layer, is deposited to fill the opening 150. Next, a CMP process is performed to planarize the inter-insulation layer 160.

As described in the above statements, the fabrication method according to the conventional semiconductor device first performs a gap-fill process of a polysilicon layer and then deposits an inter-insulation layer in the opening. Therefore, even though a void is generated in the inter-insulation layer, a bridge-fail due to the void in the inter-insulation layer is prevented.

However, when the cleaning process is performed after forming the gate spacer 130, a portion of the MTO layer 131 and the gate insulation layer 110 underneath the nitride layer 133 is etched to generate an undercut portion 170 in the edge of the gate spacer 130, as shown in FIG. 1B. Therefore, when the polysilicon layer 140 is etched to form the opening 150, the polysilicon layer 140 is not removed completely, and a polysilicon residue 175 remains in the undercut portion 170 in the edge "A" of the gate spacer 130, as shown in FIG. ID. As a result, the polysilicon residue 175 causes a bridge-fail.

Embodiments of the invention address this and other problems in the conventional art.

SUMMARY OF THE INVENTION

To overcome the above described problems, preferred embodiments of the present invention provide a semiconductor device and a fabrication method thereof forming a positive slope in a gate spacer by using a wet etching selectivity in a spacer insulation layer to prevent a bridge generation due to a polysilicon residue.

Another purpose of the present invention is to provide a semiconductor device and a fabrication method thereof using an oxide layer having a superior dielectric characteristic as a spacer insulation layer to reduce a parasitic capacitance between a gate polysilicon layer and a contact pad.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts.

DETAILED DESCRIPTION OF THE INVENTION

Reference will now be made in detail to preferred embodiments of the invention, examples of which are illustrated in the accompanying drawings.

FIG. 2A to FIG. 2E are cross sectional diagrams illustrating a fabrication method of a semiconductor device according to a preferred embodiment of the invention.

Figure 2A:
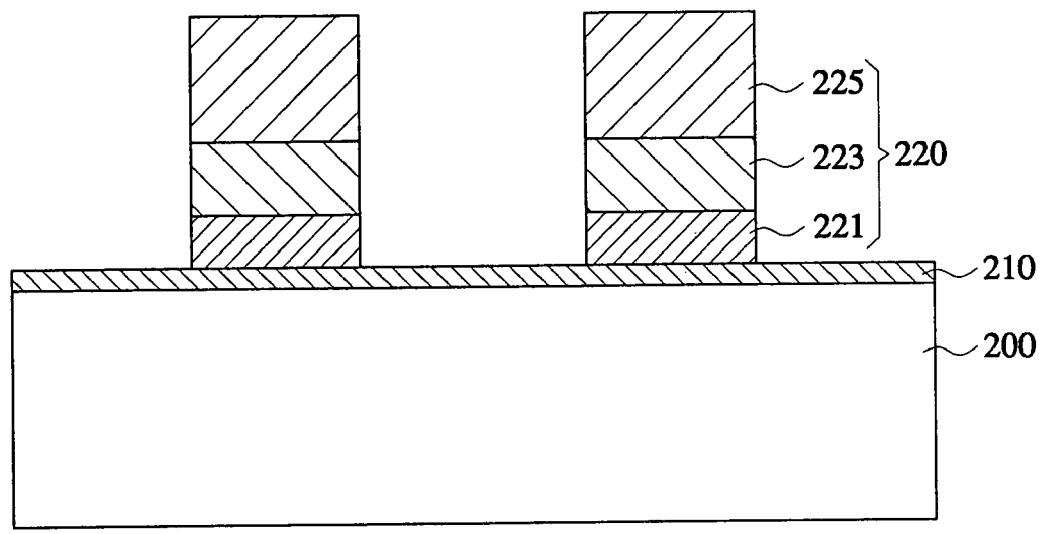
FIG. 2A to FIG. 2E are cross sectional diagrams illustrating a fabrication method of a semiconductor device according to a preferred embodiment of the invention.

Referring to FIG. 2A, a gate insulation layer 210 is formed on a silicon substrate 200. A polysilicon layer 221 and a tungsten layer 223 are sequentially deposited as a gate electrode material on the gate insulation layer 210, and a gate capping layer 225, such as a nitride layer, is deposited on the tungsten layer 223. The gate capping layer 225, the tungsten layer 223 and the polysilicon layer 221 is patterned to form a gate 220.

To prevent an electric field concentration at the edge of the polysilicon layer and to protect a tungsten layer 223 used for the gate 220, a gate poly oxidation process is performed to form an oxidation layer (not shown) on the silicon substrate 200 including the gate 200.

Figure 2B:
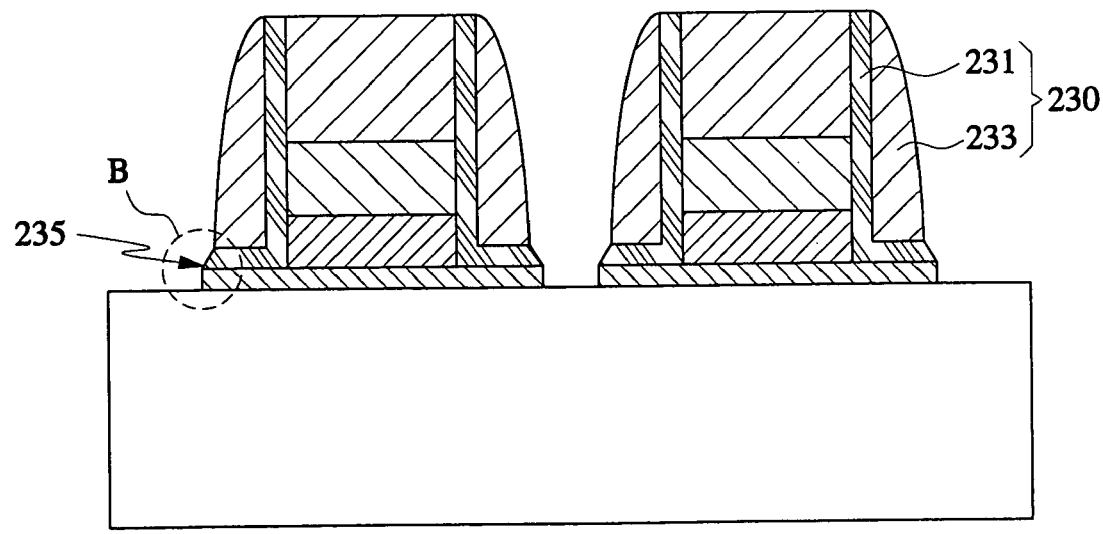

Referring to FIG. 2B, a first insulation layer 231 for a gate spacer is formed on the silicon substrate 200 including the gate 220, and a second insulation layer 233 for the gate spacer is formed on the first insulation layer 221. The first and the second insulation layers 231 and 233 are etched to form a gate spacer 230 of a side wall of each gate 220, and a cleaning process is performed to generate a positive slope 235 in the edge of the gate spacer 230.

The first insulation layer 231 for the gate spacer is an MTO layer. The second insulation layer 233 has a wet etching selectivity with respect to the first insulation layer 231, and is an oxide layer formed with an atomic layer deposition (ALD) process. After depositing the ALD oxide layer for the second insulation layer 233, an annealing process is performed to densify the second insulation layer 233. According to the annealing condition, the degree of densification in the second insulation layer 233 is varied, allowing the etching ratio to be precisely controlled.

Therefore, because the wet etching ratio between the first and the second insulation layer 231 and 233 is varied according to the annealing condition of the ALD oxide layer 233, it is possible to adjust the degree of slope at the edge of the gate spacer 230.

In the preferred embodiment of the invention, due to the predetermined wet etching ratio between the first insulation layer 231 that includes an MTO layer and the second insulation layer 233 that includes an ALD layer, the edge of the gate spacer 230 has a positive slope 235 during the cleaning process.

In other words, the gate spacer 230 includes the first insulation layer 231 formed as a linear shape on a sidewall of the gate 220, and the second insulation layer 233 formed on a sidewall of the first insulation layer 231. In the edge area "B" of the gate spacer 230, the first insulation layer 231 has a positive slope 235 with respect to the second insulation layer 233. Because an oxide layer with an excellent dielectric characteristic is used as an insulation layer for the gate spacer 230, a parasitic capacitance between the gate and the contact pad is reduced.

Figure 2C:
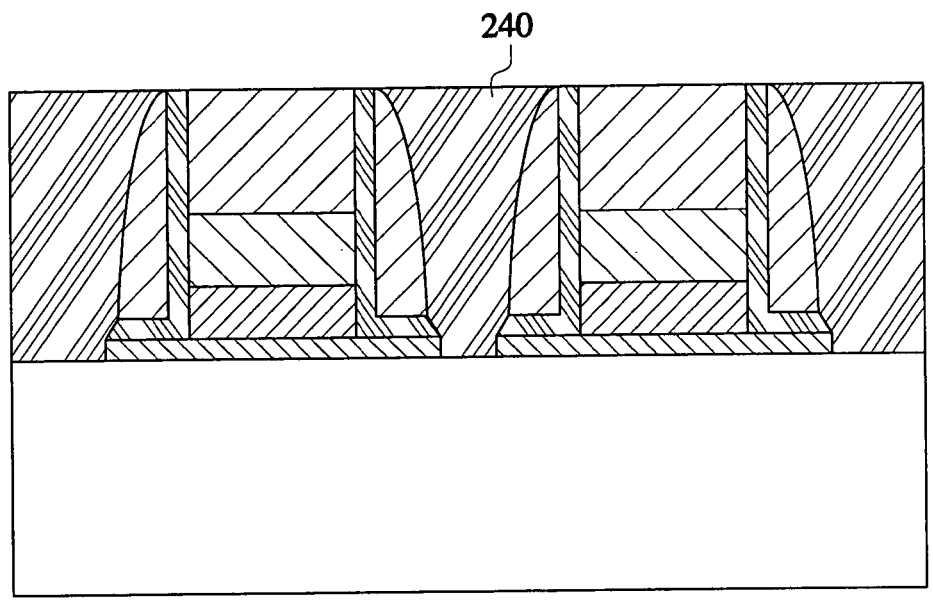

Referring to FIG. 2C, a polysilicon layer 240 for a contact pad is deposited to fill the gap between the gates 20 on the substrate 200, and a planarization process using a CMP process is performed.

Figure 2D:
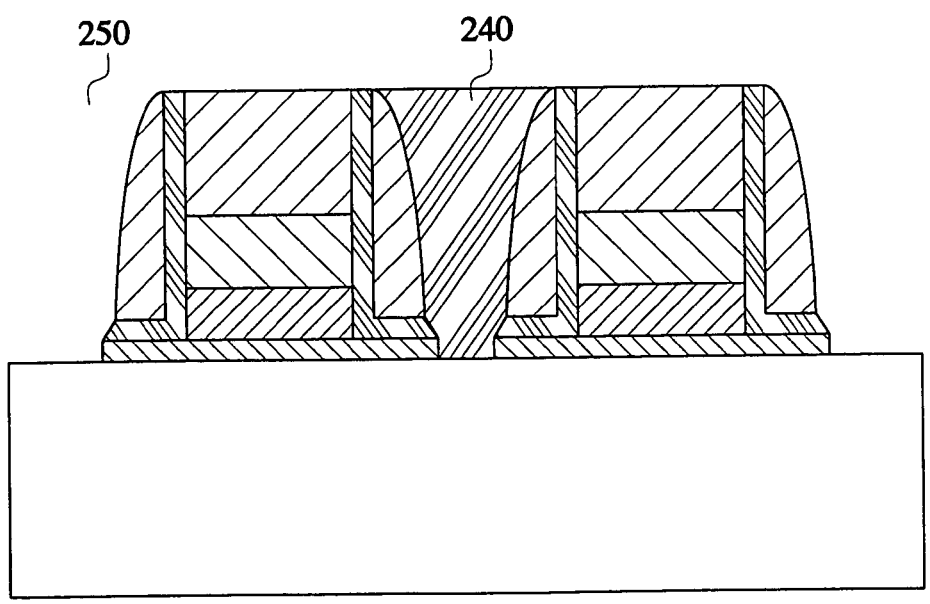

Referring to FIG. 2D, a portion of the polysilicon layer 240 (where an inter-insulation layer is to be formed) is etched to form an opening 250. At this moment, due to the positive slope 235 of the gate spacer 230, the polysilicon layer 240 is completely eliminated, with no polysilicon residue left behind.

Figure 2E:
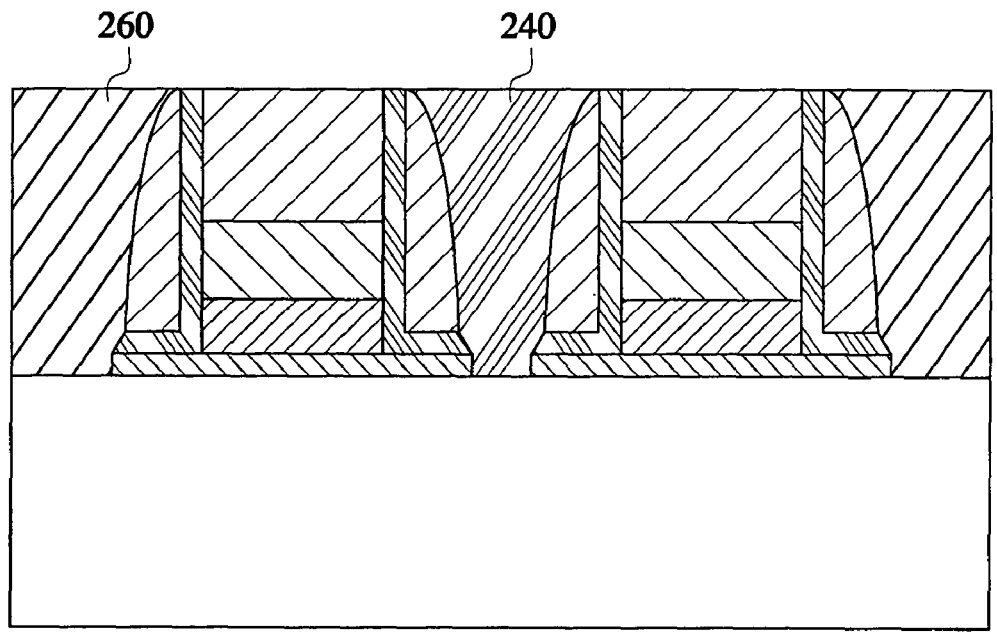

Referring to FIG. 2E, an inter-insulation layer 260 is deposited on the substrate 200 to fill the opening 250 and a planarization process, such as a CMP process, is performed.

As described in the above statements, the spacer insulation layer includes a MTO layer and an ALD layer which have a different wet etching ratio with respect to each other. Therefore, in the edge portion of the gate spacer, a positive slope is formed to prevent a polysilicon residue, and consequently bridge-fails due to the polysilicon residue are also prevented.

Furthermore, embodiments of the invention use an oxide layer with an excellent dielectric characteristic as an insulation layer for the gate spacer to reduce a parasitic capacitance between the gate polysilicon layer and the contact pad.

Embodiments of the invention will now be described in a non-limiting way. Embodiments of the invention provide a fabrication method for a semiconductor device including the steps of: forming multiple gates on a silicon substrate; forming a gate spacer having a positive slope in the edge thereof; forming a polysilicon layer on the silicon substrate to be filled between the gates; etching a portion of the polysilicon layer to form an opening exposing a portion of the silicon substrate; and forming an inter-insulation layer to the exposed silicon substrate to be filled in the opening.

According to some embodiments of the invention, the step of forming the gate spacer includes the steps of: forming a first insulation layer on the silicon substrate; forming a second insulation layer, having a wet etching selectivity to the first insulation layer, on the first insulation layer; etching the first and the second insulation layers to form the gate spacer on a sidewall of the gate; and performing a cleaning process to form the positive slope in the edge of the gate spacer.

In some embodiments, the first insulation layer may be a MTO layer, and the second insulation layer may be an ALD oxide layer.

In still other embodiments, the step of fabricating the gate spacer further includes an annealing step for high densification of the second insulation layer between the step of forming the second insulation layer and the step of etching the first and the second insulation layers.

In embodiments of the invention, the second insulation layer has a wet etching selectivity varied according to the annealing condition, and adjusts the degree of slope by a difference of the wet etching selectivity between the first insulation layer and the second insulation layer. Additionally, the first insulation layer has a positive slope with respect to the second insulation layer.

According to other embodiments of the invention, a semiconductor device includes multiple gates on a silicon substrate; a gate spacer formed on a sidewall of the gate that has a positive slope in the edge thereof; a polysilicon layer filled in the silicon substrate between the gates; and an inter-insulation layer formed on the silicon substrate including the gate and the polysilicon layer.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A fabrication method of a semiconductor device comprising:
forming gates on a silicon substrate, the gates having sidewalls;
forming a first insulation layer on the silicon substitute and the gates;
depositing a second insulation layer on the first insulation layer, the second insulation layer having a wet etching selectivity with respect to the first insulation layer;

etching the first and the second insulation layers to form gate spacers on the sidewalls;

performing a cleaning process on the gate spacers such that an entire edge of the first insulation layer has a positive slope;

depositing a polysilicon layer on the silicon substrate, the polysilicon layer filing a gap between the gates;

etching the polysilicon layer to form an opening that exposes a portion of the silicon substrate; and depositing an inter-insulation layer on the portion of the silicon substrate to fill the opening.

2. The method of claim 1, wherein forming a first insulation layer comprises forming a middle temperature oxide layer, and wherein depositing a second insulation layer on the first insulation layer comprises depositing an atomic layer deposition oxide layer on the middle temperature oxide layer.

3. The method of claim 2, wherein forming the gate spacer further comprises annealing the second insulation layer between the process of depositing the second insulation layer and the process of etching the first and the second insulation layers.

4. The method of claim 3, wherein the second insulation layer has a wet etching selectivity that is varied according to the annealing condition, and adjusts the slope degree by the difference of the wet etching selectivity between the first insulation layer and the second insulation layer.

5. The method of claim 1, wherein the first insulation layer has a positive slope with respect to the second insulation layer.

6. A method of fabricating a semiconductor device comprising:

forming gates on a silicon substrate, the gate having sidewalls;

forming a first insulation layer on the silicon substrate and the gates;

depositing a second insulation layer on the first insulation layer, the second insulation layer having a wet etching selectivity with respect to the first insulation layer;

etching the first and the second insulation layer to form gate spacer on the sidewalls;

performing a cleaning process to form a slope on the edges of the gate spacers, the slope constant along an entire edge of the first insulation layer and having a positive y-axis value;

forming a polysilicon layer on the silicon substrate between the gates;

etching a portion of the polysilicon layer to form an opening exposing a portion of the silicon substrate; and forming an inter-insulation layer on the portion of the silicon substrate that fills the opening.

7. The method of claim 6, wherein forming a the first insulation layer comprises forming a middle temperature oxide layer, and wherein depositing the second insulation layer on the first insulation layer comprises depositing an atomic layer deposition oxide layer on the middle temperature oxide layer.

8. The method of claim 7, wherein forming the gate spacer further comprises:

predetermining the slope at the edge of the gate spacer by adjusting the wet etching selectivity.

9. The method of claim 8, wherein predetermining the slope at the edge of the gate spacer by adjusting the wet etching selectivity comprises:

annealing the second insulation layer after depositing the second insulation layer but before etching the first and the second insulation layer, wherein the wet etching selectivity varies in accordance with an annealing profile of the second insulation layer.

10. The method of claim 6, wherein the first insulation layer has a positive slope with respect to the second insulation layer.

* * * * *

UNITED STATES PATENT AND TRADEMARK OFFICE
CERTIFICATE OF CORRECTION

PATENT NO. : 6,969,673 B2  Page 1 of 1
APPLICATION NO. : 10/631456
DATED : November 29, 2005
INVENTOR(S) : Lee et al.

Figure 1A:
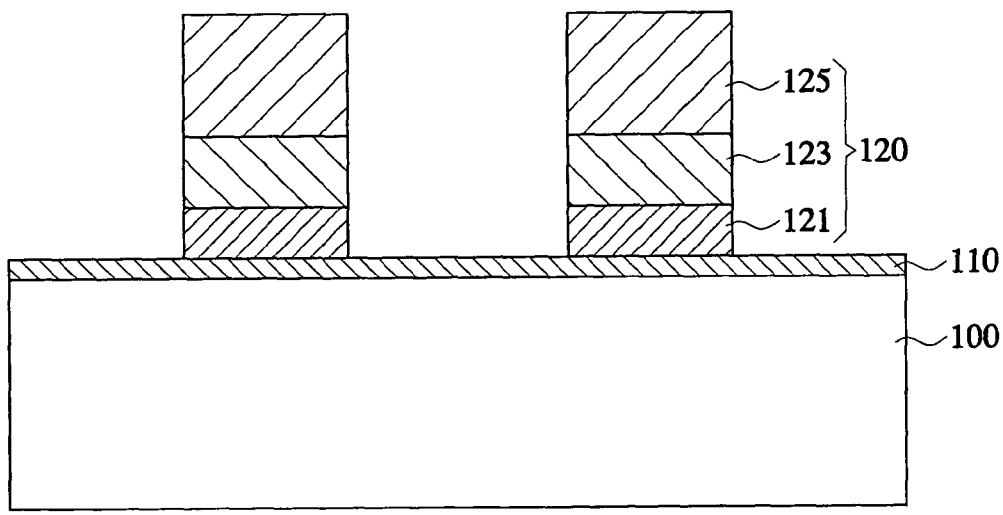
FIG. 1A to FIG. 1E are cross sectional diagrams illustrating a conventional fabrication method of a semiconductor device.
Figure 1B:
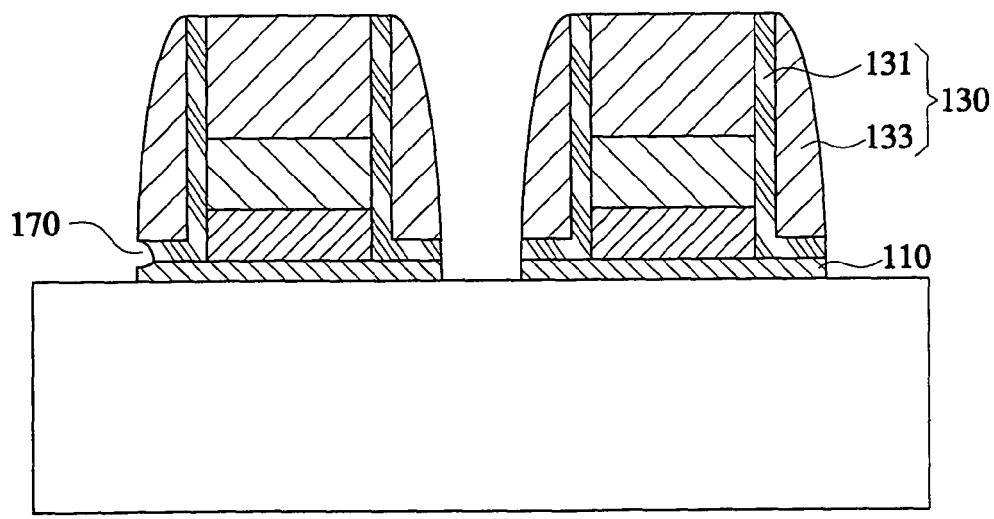
Figure 1C:
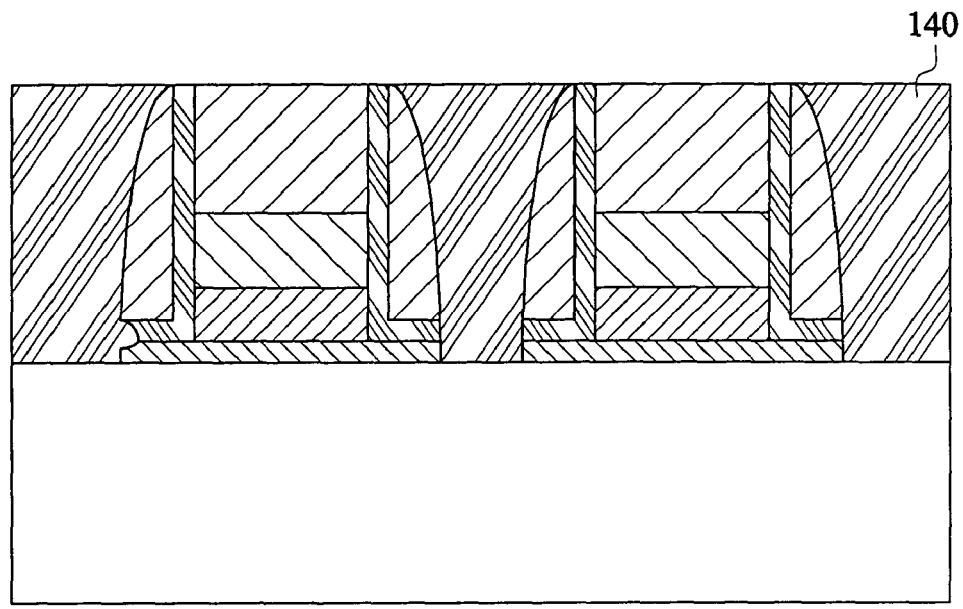
Figure 1D:
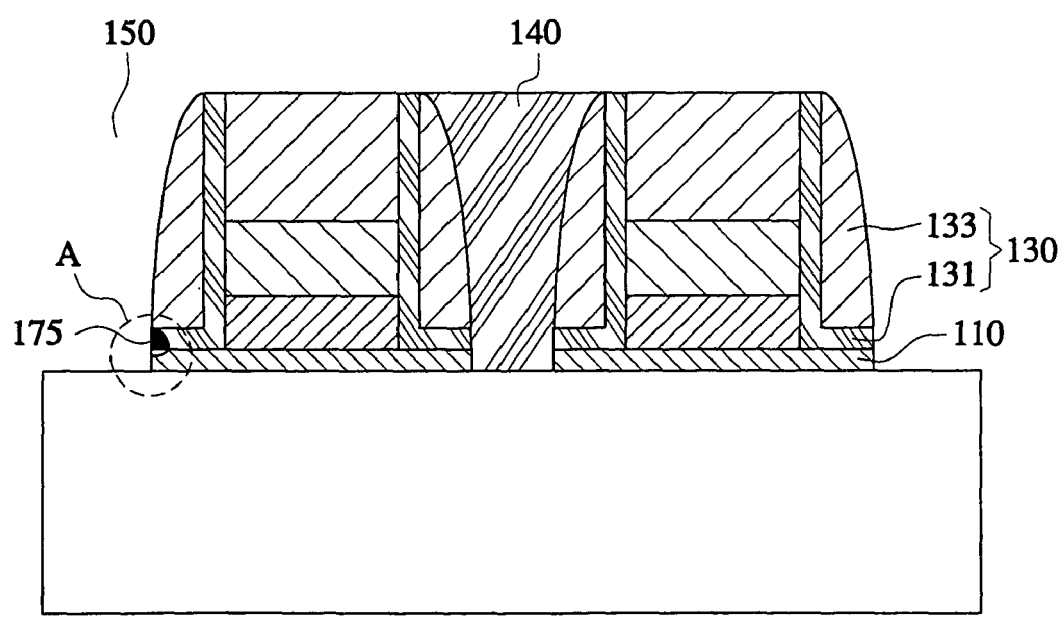
Figure 1E:
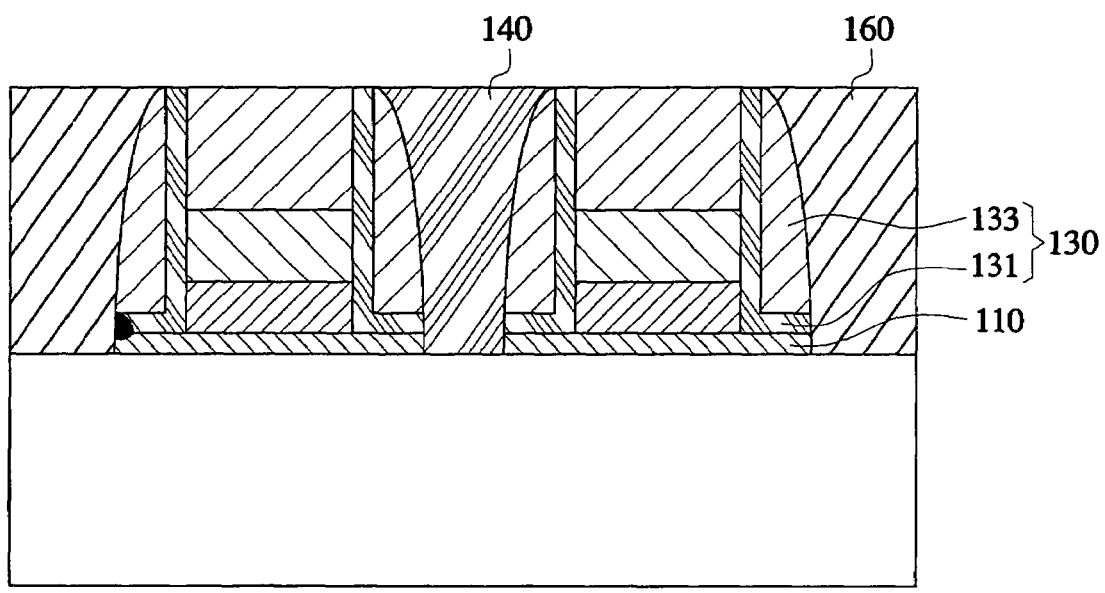

It is certified that error appears in the above-identified patent and that said Letters Patent is hereby corrected as shown below:

At column 2, line 25, please replace "FIG. ID." With --FIG. 1D.--

At column 4, line 63, please replace "substitute" with --substrate--

At column 5, line 7, please replace "filing" with --filling--

At column 6, line 2, please replace "spacer" with --spacers--

At column 6, line 15, please replace "a the first" with --the first--

Signed and Sealed this

Ninth Day of January, 2007

JON W. DUDAS
*Director of the United States Patent and Trademark Office*